United States Patent [19]

Tollefson et al.

[11] Patent Number: 4,569,877

[45] Date of Patent: Feb. 11, 1986

[54] SHEET MATERIAL ADAPTED TO PROVIDE LONG-LIVED STABLE ADHESIVE-BONDED ELECTRICAL CONNECTIONS

[75] Inventors: Richard J. Tollefson, Saint Paul; James G. Berg, North Saint Paul; Philip D. Hinderaker, Mahtomedi, all of Minn.

[73] Assignee: Minnesota Mining and Manufacturing Company, Saint Paul, Minn.

[21] Appl. No.: 722,755

[22] Filed: Apr. 15, 1985

Related U.S. Application Data

[63] Continuation-in-part of Ser. No. 451,050, Dec. 20, 1982, abandoned.

[51] Int. Cl.[4] ............................................. B32B 3/10
[52] U.S. Cl. ................................... 428/141; 428/148; 428/156; 428/163; 428/164; 428/172; 428/213; 428/323; 428/328; 428/343; 428/344; 428/349; 428/354; 428/355
[58] Field of Search ............... 29/829; 156/291, 295; 427/208.6; 428/90, 141, 148, 156, 161, 164, 172, 173, 195, 200, 201, 206, 209, 213, 214, 323, 328, 337, 343, 346, 349, 354, 356, 355, 163

[56] References Cited

U.S. PATENT DOCUMENTS

| | | | |
|---|---|---|---|
| 2,808,352 | 10/1957 | Coleman et al. | 428/344 |
| 2,964,587 | 12/1960 | Minot | 428/138 |
| 3,132,204 | 5/1964 | Giellerup | 174/117 A |
| 3,168,617 | 2/1965 | Richter | 174/117 FF |
| 3,311,696 | 5/1967 | Melnick | 428/139 |
| 3,475,213 | 10/1969 | Stow | 117/227 |
| 3,514,326 | 5/1970 | Stow | 428/328 |
| 3,762,946 | 10/1973 | Stow et al. | 428/344 |
| 3,778,306 | 12/1973 | Stow | 428/356 |
| 4,113,981 | 9/1978 | Fujita et al. | 174/88 |
| 4,217,434 | 8/1980 | Koeble | 428/355 |

FOREIGN PATENT DOCUMENTS

| | | |
|---|---|---|
| 2018774 | 4/1971 | Fed. Rep. of Germany ...... 174/117 FF |
| 2758491 | 7/1979 | Fed. Rep. of Germany ... 174/117 F |
| 2048582 | 12/1980 | United Kingdom . |

Primary Examiner—George F. Lesmes
Assistant Examiner—William M. Atkinson
Attorney, Agent, or Firm—Donald M. Sell; James A. Smith; Gerald F. Chernivec

[57] ABSTRACT

Sheet material useful for making bonded electrical connections, especially to sets of small side-by-side terminal pads. In one typical form, the sheet material is an elongated tape comprising an elongated flexible insulating backing; a plurality of narrow spaced parallel elongated electrically conductive stripes on the backing; and electrically conductive adhesive disposed over the stripes comprising a layer of adhesive material in which are dispersed a monolayer of electrically conductive elements which have an average thickness greater than the average thickness of the adhesive layer, and the top edges of which are higher than at least part of the exterior surface of the adhesive layer surrounding the element.

38 Claims, 4 Drawing Figures

SHEET MATERIAL ADAPTED TO PROVIDE LONG-LIVED STABLE ADHESIVE-BONDED ELECTRICAL CONNECTIONS

This is a continuation in part of application Ser. No. 451,050 filed Dec. 20, 1982, now abandoned.

There is a need in the electronic equipment industry for means for making convenient and secure electrical connections to sets of small side-by-side terminal pads, such as the terminal pads of a printed circuit board or a liquid crystal display. A promising technique for making such connections is taught in laid-open U.K. patent application No. 2,048,582A, published on Dec. 10, 1980 which teaches an adhesive connector tape comprising a flexible insulative sheet, a plurality of parallel, separated, electrically conductive stripes carried on the sheet, and an electrically conductive adhesive covering the conductive stripes. Electrical connections can be made by adhering an end of the tape against a set of terminal pads, with individual stripes on the tape in alignment with individual pads.

For satisfactory use of sheet material as described, the electrically conductive adhesive in the sheet material must achieve a low-resistance bond that is stable for the length of time and under the operating conditions that are expected for the sheet material. Conventional electrically conductive adhesives have not provided the needed degree of stability and low resistance. Initial resistance is too high and/or resistance increases during use, to the extent that mechanical clamping techniques are often used to supplement the adhesive bond.

SUMMARY OF THE INVENTION

The present invention provides sheet material adapted to make adhesive-bonded electrical connections of improved stability and low resistance. Briefly, this new sheet material comprises an adhesive layer which softens to an adhesive condition upon heating to an elevated temperature, and subsequently hardens to exhibit a firm and substantially nonflowable condition at room temperature; and a monolayer of discrete separated electrically conductive elements distributed in the adhesive layer;

the elements having an average thickness greater than the average thickness of the adhesive layer, and the top edge of substantially each element being higher than at least part of the exterior surface of the adhesive layer surrounding the element.

Most often, the described sheet material is carried on or applied in use to a flexible backing. During bonding of the sheet material to a substrate, the adhesive around a conductive element is pressed into contact with the substrate and forms an adhesive bond to the substrate. The backing is also pressed toward the substrate and is drawn around the individual conductive elements, which are thicker than the adhesive layer and accordingly occupy a greater height between the substrate and the backing then the adhesive layer occupies. After hardening of the adhesive, the backing appears to be held in tension around the conductive elements and to place the conductive element under compression against the substrate. With the adhesive layer in a firm and substantially nonflowable condition and with the electrically conductive elements held against the substrate, connections are formed that have low resistance and maintain that low resistance over a long useful life.

Although the electrically conductive elements are thicker on average than the average thickness of the adhesive layer, and the top edge of substantially each element is higher than at least part of the exterior surface of the adhesive layer surrounding the element, there is desirably a thin layer of adhesive material covering the elements to electrically insulate them until the time of the bonding operation. Such a thin layer preferably takes the form of a thin continuous electrically insulating adhesive layer lying over the whole sheet material as a blanket, and conforming to the protruding electrically conductive element and to any adhesive layer between the particles. But even with such an added layer of insulating material, the top edge of the electrically conductive elements is higher than the adhesive layer between the particles, including any original adhesive layer and the layer of insulating material applied over the original adhesive layer, which becomes part of the complete adhesive layer.

Typically, sheet material of the invention takes the form of an elongated tape which is wound upon itself in roll form for convenience in storage and use. Also, a plurality of electrically conductive layers are typically included as narrow parallel elongated stripes carried on the backing under the adhesive layer, with the stripes laterally spaced from one another and extending the length of the backing. Connections are thus conveniently made between terminal substrate which comprise a plurality of separated side-by-side terminal pads. However, other configurations of conductive stripes or paths besides parallel stripes are used in some embodiments of sheet material of the invention for special applications.

The utility of sheet material of the invention contrasts with previous experience with commercial pressure-sensitive adhesive connector tape products of the type described in U.S. Pat. No. 3,475,213. Those tapes use a pressure-sensitive adhesive layer coated onto an electrically conductive backing, typically a metal foil, with a monolayer of relatively large particles dispersed in the adhesive layer. The particles in these tapes were substantially the same thickness as the adhesive layer and sometimes may have been more thick than the adhesive layer. However, these tapes do not always achieve low-resistance electrical connections unless clamps are used to hold the tape against a substrate. Apparently, the force holding the particles against the substrate gradually decreases after the tape has been adhered in place as a result of flow of the adhesive.

DETAILED DESCRIPTION

Figure 1:
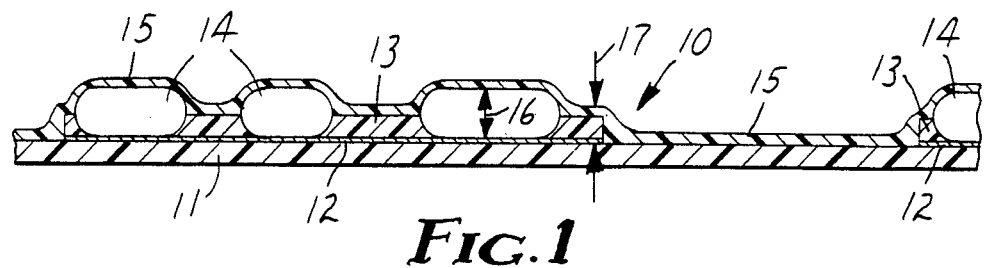
FIG. 1 is a sectional view through an illustrative electrical connector tape of the invention.

The illustrative tape 10 shown in FIG. 1 comprises a flat flexible electrically insulating sheet or backing 11, electrically conductive stripes 12, a layer of adhesive material 13 coated over the conductive stripes, electrically conductive particles 14 distributed in the adhesive layer, and a thin layer 15 of electrically insulating material coated over the whole top surface of the tape.

The flat electrically insulating sheet or backing 11 typically comprises a polymeric film, such as a film of polyethylene terephthalate or polyimide, or a resin-impregnated fibrous web. The backing should be flexible so that it will conform around the electrically conductive elements during a bonding operation and allow the adhesive carried on the backing to contact the substrate to which a bond is being made. Preferred backings have a flexibility on the order of a 25- or 50-micrometer thick film of polyethylene terephthalate. However, less flexible backings can be used, generally by using greater pressure during a bonding operation and by using somewhat thicker adhesive layers, so that the backing need not conform as greatly as it does with thinner adhesive layers.

The electrically conductive stripes 12 typically comprise a layer of metal, such as silver, gold, aluminum, or copper, vapor-deposited onto the flat backing. Other conductive layers can be used instead, so long as they leave the backing sufficiently flexible to generally conform around a conductive element during adhesion of the sheet material to a substrate. Other useful conductive layers include a metal foil (which may constitute the whole backing or may be adhered to the backing with adhesive), or a layer of metal sputtered onto the backing, or a layer formed from a conductive coating composition or ink, typically comprising a coating vehicle and conductors such as metal or carbon particles.

The adhesive material 13 is a heat-activated material which forms an adhesive bond during a heating operation. During the heating operation the adhesive material wets out a substrate to which adhesion is to be made. Subsequently, either by cooling or reaction of the ingredients, the adhesive hardens so that at room temperature the sheet material of the invention and conductive particles are held in place with respect to an adherend. At this point the adhesive material is either nontacky or poorly tacky.

A preferred adhesive material, known as a "hot-tackifying adhesive," is described in a copending application of Robert H. Stow, filed as application Ser. No. 445,864, on Dec. 6, 1982. As described in that application, the adhesive material is nontacky or poorly tacky at 20° C., but becomes pressure-sensitive and aggressively tacky when heated. Good bonds are immediately formed at a tackifying temperature without any need for crosslinking or other chemical reactions. The adhesive material comprises an acrylic polymer or mixture of acrylic polymers of at least one alkyl acrylate and/or methacrylate ester monomer (here called "acrylic ester monomer"), and differs from prior art adhesive materials in that:

(1) acrylic ester monomer provides at least 50 mol percent of the one or more acrylic polymers of the adhesive layer,
(2) said one or more acrylic polymers have a $T_g$ (glass transition temperature) or a weight-averaged $T_g$ of $-10°$ to 80° C.,
(3) a layer of the adhesive material has
   (a) a Probe Tack Value[1] of less than 75 grams of force (gf) at 20° C.,
   (b) Probe Tack Values of at least 75 gf over a range of at least 50° C., which values remain substantially constant after 30 days at 40° C., and
   (c) a Shear Value[2] of at least 25 minutes at 65° C., and
(4) up to 50 mol percent of the one or more acrylic polymers can be provided by copolymerizable monomer having a polar group, such as acrylic acid, methacrylic acid, itaconic acid, maleic acid or anhydride, the amides of said acids, acrylonitrile, methacrylonitrile, and N-vinyl-2-pyrrolidone (the notes are at the end of the specification).

The one or more acrylic polymers may be a homopolymer of an acrylic ester monomer which provides a $T_g$ within the range of $-10°$ to 80° C., e.g., methyl acrylate, or a copolymer of acrylic ester monomer and copolymerizable polar monomer having a $T_g$ within that range. Useful acrylic ester monomers which homopolymerize to a $T_g$ of at least $-10°$ include methyl acrylate, methyl methacrylate, ethyl methacrylate, propyl methacrylates, butyl methacrylates, bornyl acrylates, bornyl methacrylates, 2-phenoxyethyl acrylate, 2-phenoxyethyl methacrylate, the mono- and di-methyl and ethyl esters of itaconic acid, and the mono- and di-methyl and ethyl esters of maleic acid. Useful acrylic ester monomers which provide reduced $T_g$ include ethyl, butyl, and octyl acrylates, and n-amyl, hexyl and octyl methacrylates. A copolymer of 43 mol percent of methyl methacrylate, 53 mol percent of methyl acrylate and 4 mol percent of acrylamide had a $T_g$ of about 50° C. A copolymer of 73 mol percent of methyl methacrylate, 19 mol percent of methyl acrylate, 4 mol percent of ethyl acrylate, and 4 mol percent of acrylamide had a $T_g$ of about 79° C.

The described hot tackifying adhesive material becomes pressure-sensitive and aggressively tacky when heated, typically for use in this invention to a temperature of about 40° C. or above, and preferably 75° C. or above. When later subjected to temperatures at or even above the bonding temperature, adequate bonding strength may be retained. Electrically conductive particles may be dispersed into the adhesive material to form a conductive bond, and the particles and adherends tend to be retained in their bonded position by the firm adhesive material at elevated temperatures as well as room temperature.

Other copolymerizable monomers may also be employed in small amounts without detracting from the value of the acrylic copolymer for the purposes taught in the application. Among such copolymerizable monomers are styrene, vinyl acetate and vinyl chloride, each of which can be used in amounts up to about 5 mol percent of the total monomers.

Bonds exhibiting the best durability during prolonged exposure to high humidity (e.g., 95% RH) at elevated temperatures (e.g., 80° C.) are obtained with hot tackifying acrylic adhesives in which the acrylic polymer has an interacted functionally reactive organosilane coupling agent in an amount of at least 0.2 part per 100 parts by weight of total monomer. Best results are attained at about 0.5 to 4 percent.

The organosilane may be interpolymerized with the acrylic ester monomer, with or without other copolymerizable monomers, or it may be reacted with functional groups on the backbone of an acrylic polymer. Either process results in what is hereinafter called an "acrylic-silane interpolymer."

The organosilane has the general formula $R_{(4-n)}SiX_n$, where X is a hydrolyzable group such as ethoxy, methoxy, or 2-methoxy-ethoxy; R is a monovalent organic radical of from 1 to 12 carbon atoms which contains a functional organic group such as mercapto, epoxy, acrylyl, methacrylyl, or amino; and n is an integer of from 1 to 3.

As is known in the art, the organosilane can cause solutions of polymers to gel, so that it may be desirable to employ an alcohol or other known stabilizers. When the organosilane is to be copolymerized with the other monomer, a stabilizer should be selected that does not interfere with the polymerization. Methanol is especially useful and is preferably employed in amounts from about twice to about four times the amount of the organosilane.

Other heat-activated adhesive materials that can be used are hot-melt adhesive materials, which are typically thermoplastic materials that soften to a flowable state and then cool to form an adhesive bond, and reactive compositions, such as epoxy-based adhesives. Sheet material in which the adhesive is pressure-sensitive at room temperature may also benefit from the present invention, i.e., by the use of electrically conductive elements in a size relationship as taught herein with the layer of pressure-sensitive adhesive on a flexible backing, especially under circumstances in which the bonded electrical connection to be made with the sheet material does not experience high ambient temperatures and stresses.

The conductive particles 14 in the illustrative sheet material of the invention shown in FIG. 1 are flattened to a generally common thickness. For example, a sieved batch of originally spherical particles may be passed through nip rolls such as in a paint mill; see U.S. Pat. No. 3,475,213. The flattened particles are especially desirable because they tend to lie on their flattened side, and a high percentage of the particles participate in conducting electrically through the adhesive layer in an adhesive bond. Spherical particles are also useful, especially when screened within narrow size ranges so that a high percentage of the particles are of about the same size. The particles should be sufficiently firm or rigid so as to penetrate through the insulating layer 15 during a bonding operation; but some deformation of the particles may occur during the bonding operation, e.g., by pressure against a rigid substrate. The particles are usually metal, preferably silver but alternatively copper or aluminum (for which additives as described in U.S. Pat. No. 3,475,213 are desirable to achieve compatibility), or various other metals, metallized particles such as glass beads, carbon particles, etc. Also, electrically conductive elements may take the form of material embossed from a conductive backing, such as the embossed protrusions from a metal foil taught in U.S. Pat. No. 3,497,383. Or small particles clustered closely together may comprise an electrically conductive element.

The particles can range in thickness from at least 10 to 500 micrometers, though the preferred range for presently contemplated products is about 20 to 100 micrometers, and the adhesive layer can range in thickness from at least 6 to 450 micrometers. (The average thickness of the adhesive layer is determined by measuring the approximate volume of adhesive material in the layer, and dividing that volume by the area of the sheet material.) With presently contemplated typical sizes and densities of electrically conductive elements, backings, etc., good adhesive bonds generally call for the average thickness of the adhesive layer to be no less than about sixty percent (60%) of the average thickness of the electrically conductive elements. But lacking low-resistance electric connections are achieved by making the adhesive layer significantly thinner than the electrically conductive elements, i.e., with an average thickness generally about ninety-five percent (95%) or less of the average thickness of the conductive elements. Best results are obtained when the average thickness of the adhesive layer is about 70 to 80 percent of the average thickness of the electrically conductive elements.

As a corollary to the above discussion, and as a further contribution to lasting low-resistance electric connections, the top edge of substantially all the electrically conductive elements is higher than at least part of the adhesive layer surrounding the particles. That is, the dimension 16 of substantially each particle 14 in FIG. 1 is greater than the dimension 17 of the adhesive layer at at least some points on the exterior surface of the adhesive surrounding the particle. Preferably, the whole of substantially each particle is encircled by an area of the adhesive layer that is less high than the top edge of the electrically conductive element. Also, the electrically conductive elements are preferably substantially all separated on average by at least the average diameter of the elements, and more typically four or five times or more the average diameter, so as to allow the backing to conform around the elements during a bonding operation. On the other hand, the electrically conductive elements preferably occupy at least 2 percent, and more preferably at least 4 percent, of the area of the sheet material.

The layer 15 of electrically insulating material provides useful electrical insulation even though it should be thin, on the order of 10 micrometers in thickness over the conductive particles 14 in a construction as shown in FIG. 1. Resistances through the layer 15 to the conductive particles of at least one megohm should be achieved to obtain the desired insulation. Resistance is measured by laying a test sample over a one-centimeter-square copper substrate, with the exterior surface of the insulation layer of the sample against the substrate, and laying a 500-gram weight over the test sample at room temperature. Electrical connection has previously been made between a metal conductor and the conductive layer in the test sample, e.g., the stripes 12 in the sheet material shown in FIGS. 1 and 2, by heat and pressure. A voltage of 5 volts is applied to the metal conductor, with the copper substrate maintained at ground, and the resistance in the circuit measured.

The insulating layer 15 preferably comprises the same or a similar material as the adhesive material 13 in which the conductive particles 14 are dispersed. The hot-tackifying adhesive taught in the previously mentioned copending application of Robert H. Stow is a preferred material. One advantage is that it exhibits adhesive character over a wide temperature interval so that adhesive connections can be maintained even though the bond area has not cooled to room temperature. In some cases the insulating layer may comprise a different variety of hot-tackifying adhesive, such as a variety having a lower glass transition temperature ($T_g$) than the adhesive material in which conductive particles are dispersed. The higher-$T_g$ adhesive material offers greater firmness at room temperature, while the lower-$T_g$ insulating layer flows readily and assists in formation of a desired adhesive bond. Other adhesive materials such as hot-melt adhesives or reactive compositions may also be used.

Figure 2:
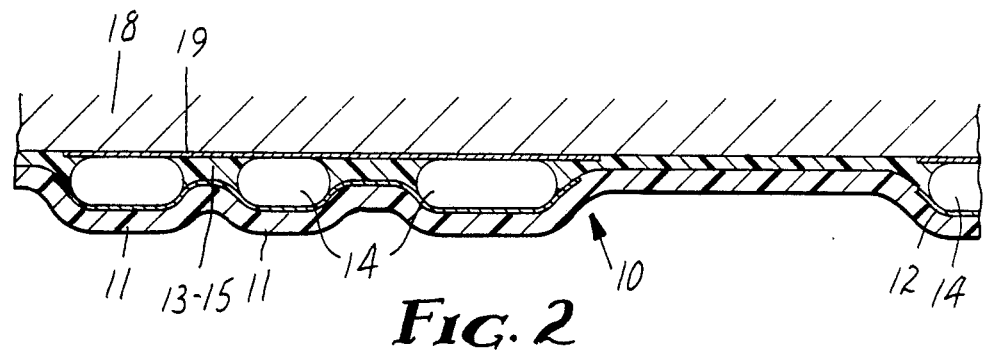
FIG. 2 is a drawing showing the illustrative tape of FIG. 1 adhered to a substrate.

After bonding to a substrate, as shown for the substrate 18 carrying conductive pads 19 in FIG. 2, the contact surface of sheet material of the invention generally follows the surface of the substrate. (The adhesive layer 13 and insulating layer 15 are shown to have merged into one adhesive layer 13–15). The terminal substrates with which sheet material of the invention is used may be planar, with terminal pads embedded in the substrate and coplanar with the rest of the substrate, in which case sheet material of the invention forms a generally planar full-area contact with the substrate. Preferably, however, the terminal pads are slightly raised.

As also shown in FIG. 2, the side of the sheet material 10 opposite from the substrate 18 is generally contoured after a bonding operation, with the backing or sheet 11 generally following the contour of the conductive particles, and the backing typically feels roughened by this contouring. Interestingly, the contoured surface can be obtained even by pressing a smooth-surfaced rigid bonding head against the back surface of the backing or sheet 11. Apparently stresses are developed within the sheet 11 during the bonding operation that force the sheet upwardly into the spaces between the particles 14 toward the substrate 18. When the adhesive material 13-15 hardens, as by cooling, the backing 11 is held against the substrate and apparently holds the particles in compression against the substrate (although the element is in compression against the substrate, it need not be in direct contact with the substrate, but may be separated from the substrate by a thin layer of adhesive material).

The embodiment of sheet material shown in FIG. 1 illustrates another desirable feature of sheet material of the invention. That is, it is desirable for the adhesive surface of the sheet material to be profiled, with at least part of the surface of the adhesive, for example, the part that overlies spaces between the electrically conductive stripes, being recessed below other areas of the adhesive surface. Accordingly, some adhesive material in the area of the conductive stripes can be displaced during the bonding operation into the recessed areas between the stripes, and the electrically conductive elements become held in closer electrical association with the substrate. Such displacement occurs in proportion to the degree of flowability of the adhesive material and the degree of heat and pressure applied to the adhesive material during the bonding operation. A hot-tackifying adhesive material may not flow extensively during a bonding operation, and as shown in FIG. 2, the flexible backing conforms to the profiled thickness of the adhesive layer. Desirably the recessed area of the adhesive layer are recessed at least 10 percent and preferably at least 25 percent, below the average height of the non-recessed area of the adhesive layer. The insulating layer 15 in the embodiment of FIG. 1, is a rather constant thickness and conforms to the profile left by the protruding particles and adhesive material 13.

In the finished bond the electrically conductive elements occupy a sufficient proportion of the thickness of the adhesive bond to allow any necessary dielectric breakdown through the adhesive material and achieve conduction between the conductive stripe and a substrate to which the sheet material is adhered. Since the electrically conductive elements occupy a minor proportion of the area in the plane of a bond, they leave substantial area in which adhesive contacts the adherend.

Figure 3:
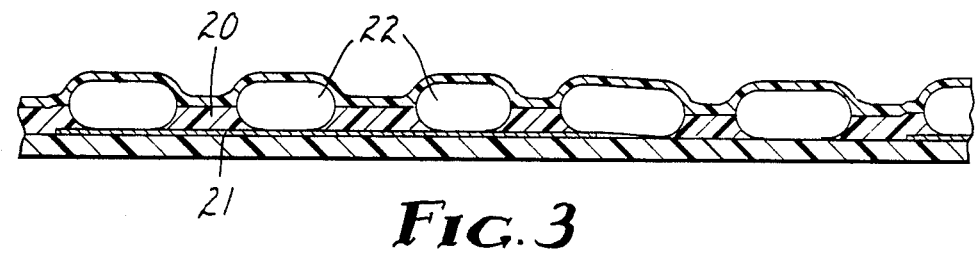
FIGS. 3 and 4 are sectional views through different illustrative electrical connector tapes of the invention.

Together, the adhesive material and electrically conductive elements provide an electrically conductive adhesive layer which is conductive through the layer but not laterally within the layer. As shown in FIG. 3, in some embodiments of the invention electrically conductive adhesive 20 extends over the whole surface of one side of sheet material of the invention, thereby avoiding the necessity for limited coating of the electrically conductive adhesive over only an electrically conductive stripe. Since the electrically conductive adhesive is not conductive laterally, the adjacent stripes 21 remain electrically isolated from one another. The conductive particles 22 in the electrically conductive adhesive make connection only through the adhesive layer from the electrically conductive stripe 21 to a terminal pad with which the stripe is aligned.

Figure 4:
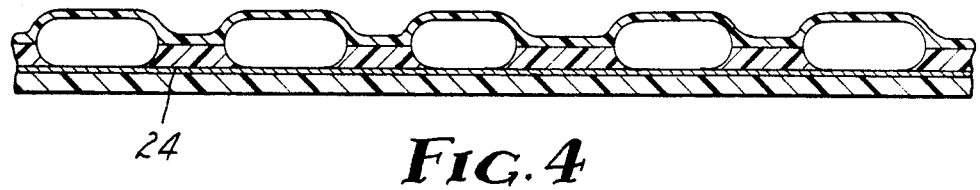

Another variety of sheet material of the invention shown in FIG. 4 includes an electrically conductive layer 24 which extends over the full extent of the sheet material. Sheet material having such a layer is useful for making ground connections, as between a metal chassis and a part mounted on the chassis.

Sheet material of the invention, especially when an elongated tape to be wound upon itself in roll form, preferably includes a low-adhesion backsize on the non-adhesive side, or a release liner disposed over the insulating layer. Also, primers may be applied to a polymeric or metallic backing to promote adhesion to an adhesive or insulating layer carried on the backing.

Sheet material of the invention is generally applied by aligning an end of the tape over the desired substrate to which connection is to be made, pressing the sheet material against the substrate, and at the same time heating the sheet material. Transfer adhesive sheet materials of the invention may be placed between desired adherends and a bonded electrical connection made by applying heat and pressure. In such transfer adhesive sheet materials electrically conductive elements may be dispersed in an adhesive material which forms a support web for the elements, and an insulating layer may be disposed on one or both sides of the element-containing web and the elements may protrude from both sides of the web. Alternatively, the material in which the elements is dispersed is a non-adhesive polymeric film, and adhesion is provided by the insulating layer. Similarly, the layer 13 in a product as shown in FIGS. 1 and 2 may be non-adhesive, e.g., because of reaction to a durable, firm state.

The invention will be further illustrated by the following examples.

EXAMPLE 1

A film of polyethylene terephthalate 25 micrometers thick was vapor-coated on one surface through a slotted mask to form 875-micrometer-wide continuous stripes of silver spaced 875 micrometers apart. The stripes were approximately 400 angstroms (40 nanometers) thick and had an electrical resistance of 4 ohms per centimeter length. Electrically conductive adhesive was prepared by mixing 94.9 volume-parts of acrylic terpolymer which comprised 10.4 weight-percent methyl methacrylate, 85.6 weight-percent methyl acrylate, and 4 weight-percent acrylamide dissolved in ethyl acetate, and 5.1 volume-parts of silver particles. The particles had been sieved through a 140-mesh screen (U.S. standard; 105 micrometer mesh size) and retained on a 170-mesh screen (88 micrometers) and then passed through a roller mill to flatten the particles to approximately 48 micrometers thickness. The mixture of adhesive and particles was applied in registry over the conductive stripes by coating through an apertured mask. After drying, the adhesive terpolymer occupied a thickness of approximately 20 micrometers.

An insulating layer of acrylic terpolymer comprising 40 weight-percent ethyl acrylate, 56 weight-percent methyl acrylate, and 4 weight-percent acrylamide dissolved at about 25 weight-percent solids in ethyl acetate was then applied over the whole surface of the sheet material by bar coating, thereby covering the adhesive-coated stripes and the film backing between the stripes. After drying, a rather constant-thickness layer approximately 10 micrometers thick was formed, as shown in FIG. 1. The ratio of the combined thickness of the adhesive layer and insulating layer (30 micrometers) to the average thickness of the particles was 62.5 percent.

The resistance through the layer as measured by the method described above was about 1000 megohms. For comparison a similar tape without the insulating layer was prepared and found to exhibit 10 ohms resistance.

One end of the tape of this example was adhered to the electrically conductive terminal pads of a printed circuit test board by pressing the tape against the substrate with a force of 150 pounds per square inch (10.5 kilograms per square centimeter) and heating the end of the tape to a temperature of 170° C. for 5 seconds. After the connection had been allowed to cool, the resistance at the connection was measured by the four terminal resistance method and found to be 10 milliohms. The backing was roughened in the manner shown in FIG. 2. The peel strength of the bond to the substrate was also measured according to ASTM D-1000 and found to be 2.5 to 5 pounds per inch width (0.45 to 0.9 kilograms per centimeter).

EXAMPLE 2

Two different tapes of the type described in Example 1 were prepared using particles having a flattened thickness of approximately 40 micrometers, sufficient adhesive material in mixture with the particles to provide an adhesive layer approximately 15 micrometers in thickness, and insulating layers of two different thicknesses—one (Example 2A) approximately 9 micrometers and the other (Example 2B) approximately 21 micrometers. The ratio of the combined thickness of the adhesive layer and insulating adhesive layers to the average particle thickness was 60% for Example 2A and 90% for Example 2B. Pieces of tape were cut to size and bonded between the conductive pads of a printed circuit board and a indium tin oxide (ITO) vapor-coated surface on a glass test panel using a pressure of 200 psi at 150° C. for five seconds. The multiple connections made by each tape to the ITO test panel were monitored for individual contact resistances using a four-wire ohms method. The test panel was cycled between −40° C. and 105° C. every four hours. Table I below shows the results for the maximum contact resistance observed during the reported test period. The data demonstrates stable electrical performance during the stated thermal cycling for the construction using adhesive thickness in the range of 60 percent of particle thickness, and poor electrical performance when adhesive thickness is 90 percent of particle thickness. In other tests, with less temperature cycling and shorter times, tapes with a 90 percent adhesive thickness to particle thickness ratio have provided adequate stability.

TABLE I

Effects of Adhesive Thickness on Performance in Thermal Age Testing

| Example No. | Ratio of Adh/particle Thickness (%) | Maximum Individual Conductor Bond Resistance to ITO Surface (Ohms) | | |
|---|---|---|---|---|
| | | Initial | 100 hours | 1000 hours |
| 2A | 60 | 242 | 289 | 167 |
| 2B | 90 | 267 | >10,000 | >10,000 |

[1]The Probe Tack Value is determined as described in ASTM D-2979 except in the following respects:
1. To provide Probe Tack Values at various test temperatures, the probe and the annular weight are heated to the test temperature, except that the annular weight is never heated above 220° C.
2. The probe end is an annulus having inner and outer diameters of 3.83 and 5.10 mm.
3. The annular weight is 19.8 grams.
4. Ten-second dwell.

[2]The Shear Value is determined by heating a bright annealed stainless steel panel in an oven for 15 minutes at 115° C. above the weight-averaged $T_g$ of the adhesive polymer. With the steel panel horizontal, part of a tape 1.27 cm in width is adhered to the steel panel using a 2.04-kg hand roller conforming to Federal Standard 147, giving 2 passes in each direction. The length of tape adhering to the panel is trimmed to exactly 1.27 cm in length and this assembly is left at the bonding temperature for 15 minutes longer. The plate is transferred to an oven having a shear stand which allows a 2° backward tilt of the panel at its top (shear weight will force tape toward panel slightly). After 15 minutes at 65° C., a one-kilogram weight is hung from the free end of the tape. The time after which the weight falls is the 65° C. Shear Value.

What is claimed is:

1. Sheet material adapted to make bonded electrical connections to a substrate, the sheet material comprising
    an adhesive layer which softens to an adhesive condition upon heating to an elevated temperature, and subsequently hardens to exhibit a firm and substantially nonflowable condition at room temperature; and
    a monolayer of discrete separated electrically conductive elements dispersed in the adhesive layer; the average thickness of the adhesive layer being between about 60 and 95 percent of the average thickness of the electrically conductive elements; and the top edge of substantially each element being higher than at least part of the exterior surface of the adhesive layer surrounding the element.

2. Sheet material of claim 1 in which the electrically conductive elements are separated on average by a distance equal to at least the average diameter of the elements.

3. Sheet material of claim 1 in which the exterior surface of the adhesive layer is configured so that at least part of the exterior surface of the adhesive layer is recessed below other areas of the surface.

4. Sheet material of claim 1 in which the adhesive layer is a hot-tackifying adhesive which exhibits a Probe Tack Value of at least 75 grams of force at a temperature of 40° C. or more.

5. Sheet material of claim 1 in which the adhesive layer comprises one or more acrylic polymers and
    (1) acrylic ester monomer provides at least 50 mol percent of the one or more acrylic polymers of the adhesive layer,
    (2) said one or more acrylic polymers have a $T_g$ or a weight-averaged $T_g$ of −10° to 80° C., and
    (3) said adhesive layer has
        (a) a Probe Tack Value of less than 75 gf at 20° C.,
        (b) Probe Tack Values of at least 75 gf over a range of at least 50° C., which values remain substantially constant after 30 days at 40° C., and (c) a Shear Value of at least 25 minutes at 65° C.;
and ethyl esters of itaconic acid and the mono- and di ethyl esters of maleic acid.

6. Sheet material of claim 5 in which the adhesive layer comprises one or more acrylic copolymer of monomers, up to 50 mol % of which is at least one copolymerizable monomer selected from acrylic acid, methacrylic acid, itaconic acid, maleic acid, maleic anhydride, amides of said acids, acrylonitrile, methacrylonitrile, and N-vinyl-2-pyrrolidone.

7. Sheet material of claim 5 in which the acrylic ester monomer is selected from alkyl acrylates having 1–8 carbon atoms in their alkyl groups, alkyl methacrylates having 1–8 carbon atoms in their alkyl groups, bornyl acrylates, bornyl methacrylates, 2-phenoxyethyl acrylate, 2-phenoxymethyl acrylate, the mono- and di-methyl and ethyl esters of itaconic acid, and the mono- and di-methyl and ethyl esters of maleic acid.

8. Sheet material of claim 5 in which at least one of styrene, vinyl acetate and vinyl chloride comprises up to 5 mol % of the total monomers.

9. Sheet material of claim 1 in which the adhesive layer comprises an acrylic-silane interpolymer of primarily acrylic ester monomer interacted with organosilane in an amount of at least 0.2 part per 100 parts by weight of total monomer, which interpolymer has a $T_g$ of $-10°$ to 80° C.

10. Sheet material of claim 9 in which the acrylic ester monomer is selected form alkyl acrylates and methacrylates having 1–8 carbon atoms in their alkyl groups; bornyl acrylates and methacrylates; 2-phenoxyethyl acrylate and methacrylate; the mono- and di methyl and surface of the adhesive layer surrounding the particle, whereby after adhesion of the adhesive layer to a substrate the film conforms around the particle and the particle is held against the substrate.

11. Sheet material of claim 9 in which the amount of organosilane is from 0.5 to 4 parts per 100 parts by weight of total monomer.

12. Sheet material of claim 9 in which the acrylic-silane interpolymer comprises monomers, up to 50 mol % of which is at least one copolymerizable monomer selected from acrylic acid, methacrylic acid, itaconic acid, maleic acid, maleic anhydride, amides of said acids, acrylonitrile, methacrylonitrile, and N vinyl-2-pyrrolidone.

13. Sheet material of claim 12 in which styrene, vinyl acetate and vinyl chloride comprise up to 5 mol % of the total monomers.

14. Sheet material of claim 1 which includes a flexible backing on which the adhesive layer is carried and an electrically conductive layer between the flexible backing and the adhesive layer.

15. Sheet material of claim 14 in which the backing is a polyester film of about 50 micrometers thickness or less.

16. Sheet material of claim 14 which includes a plurality of electrically conductive layers in the form of narrow parallel electrically conductive stripes.

17. Sheet material of claim 16 in which electrically conductive elements are disposed in the adhesive layer only over the electrically conductive stripes.

18. Sheet material of claim 16 in which the exterior surface of the adhesive layer is configured so that at least part of the exterior surface that overlies spaces between the conductive stripes is recessed below other areas of the surface.

19. Sheet material adapted to make bonded electrical connections to a substrate, the sheet material comprising
a flexible polyethylene terephthalate film about 25 micrometers or less in thickness and carrying an electrically conductive metal layer thereon;
an adhesive layer carried on the film which softens to a tacky adhesive condition upon heating to an elevated temperature, and upon cooling to room temperature assumes a firm and substantially nonflowable condition; and
a monolayer of discrete separated electrically conductive particles distributed in the adhesive layer and separated on average by a distance equal to at least the average diameter of the particles;
the adhesive layer having an average thickness between about 60 to 95 percent of the average thickness of the particles, and the top edge of substantially each particle being higher than at least part of the exterior said adhesive layer adheres well to a clean substrate upon contact at any temperature within said 50° C. range.

20. The sheet material of claim 19 in which the average thickness of the adhesive layer is between 70 and 80 percent of the average thickness of the electrically conductive particles.

21. Sheet material of claim 19 in which the average thickness of the electrically conductive particles is 100 micrometers or less.

22. Sheet material of claim 20 in which the adhesive layer is a hot tackifying adhesive which exhibits a Probe Tack Value of at least 75 grams of force at a temperature of 40° C. or more.

23. Sheet material of claim 19 in which the adhesive layer comprises an acrylic-silane interpolymer of primarily acrylic ester monomer interacted with organosilane in an amount of at least 0.2 part per 100 parts by weight of total monomer, which interpolymer has a $T_g$ of $-10°$ to 80° C.

24. Sheet material of claim 19 in which the electrically conductive elements are separated on average by at least about four times their average diameter.

25. Sheet material of claim 19 in which there are a plurality of electrically conductive metal layers carried on the polyethylene terephthalate film, said layers taking the form of narrow elongated electrically conductive stripes.

26. Sheet material of claim 25 in which the exterior surface of the adhesive layer is configured so that at least part of the exterior surface that overlies spaces between the conductive stripes is recessed below other areas of the surface.

27. Sheet material of claim 19 in which the adhesive layer comprises one or more acrylic polymers and
(1) acrylic ester monomer provides at least 50 mol percent of the one or more acrylic polymers of the adhesive layer,
(2) said one or more acrylic polymers have a $T_g$ or a weight-averaged $T_g$ of $-10°$ to 80° C., and
(3) said adhesive layer has
  (a) a Probe Tack Value of less than 75 gf at 20° C.,
  (b) Probe Tack Values of at least 75 gf over a range of at least 50° C., which values remain substantially constant after 30 days at 40° C., and
  (c) a Shear Value of at least 25 minutes at 65° C.; and said adhesive layer adheres well to a clean substrate upon contact at any temperature within said 50° C. range.

28. Sheet material of claim 27 in which the adhesive layer comprises one or more acrylic copolymer of monomers, up to 50 mol % of which is at least one copolymerizable monomer selected from acrylic acid, methacrylic acid, itaconic acid, maleic acid, maleic anhydride, amides of said acids, acrylonitrile, methacrylonitrile, and N-vinyl-2-pyrrolidone.

29. Sheet material of claim 27 in which the acrylic ester monomer is selected from alkyl acrylates having 1-8 carbon atoms in their alkyl groups, alkyl methacrylates having 1-8 carbon atoms in their alkyl groups, bornyl acrylates, bornyl methacrylates, 2-phenoxyethyl acrylate, 2-phenoxymethyl acrylate, the mono- and di-methyl and ethyl esters of itaconic acid, and the mono- and di-methyl and ethyl esters of maleic acid.

30. Sheet material of claim 27 in which at least one of styrene, vinyl acetate and vinyl chloride comprises up to 5 mol % of the total monomers.

31. Sheet material adapted to make bonded electrical connections to a substrate, the sheet material comprising
    a flexible backing carrying narrow electrically conductive metal stripes thereon;
    an adhesive layer carried on the backing over said stripes which softens to an adhesive condition upon heating to an elevated temperature, and subsequently hardens to exhibit a firm and substantially nonflowable condition at room temperature;
    a monolayer of discrete separated electrically conductive elements distributed in the adhesive layer and separated on average by a distance equal to at least the average diameter of the elements;
    the conductive elements having an average thickness greater than the average thickness of the adhesive layer, and the top edge of substantially each conductive element being higher than at least part of the exterior surface of the adhesive layer surrounding the conductive element, whereby after adhesion of the adhesive layer to a substrate the backing conforms around the conductive element and the conductive element is held against the substrate.

32. The sheet material of claim 31 in which the average thickness of the adhesive layer is between 60 and 90 percent of the average thickness of the electrically conductive elements.

33. Sheet material of claim 31 in which the adhesive layer is a hot tackifying adhesive which exhibits a Probe Tack Value of at least 75 grams of force at a temperature of 40° C. or more.

34. Sheet material of claim 31 in which the adhesive layer comprises an acrylic-silane interpolymer of primarily acrylic ester monomer interacted with organosilane in an amount of at least 0.2 part per 100 parts by weight of total monomer, which interpolymer has a $T_g$ of $-10°$ to 80° C.

35. Sheet material of claim 31 in which the exterior surface of the adhesive layer is configured so that at least part of the exterior surface that overlies spaces between the conductive stripes is recessed below other areas of the surface.

36. Sheet material of claim 31 in which the adhesive layer comprises one or more acrylic polymers and
    (1) acrylic ester monomer provides at least 50 mol percent of the one or more acrylic polymers of the adhesive layer.
    (2) said one or more acrylic polymers have a $T_g$ or a weight-averaged $T_g$ of $-10°$ to 80° C., and
    (3) said adhesive layer has
        (a) a Probe Tack Value of less than 75 gf at 20° C.,
        (b) Probe Tack Values of at least 75 gf over a range of at least 50° C., which values remain substantially constant after 30 days at 40° C., and
        (c) A Shear Value of at least 25 minutes at 65° C.; and
    said adhesive layer adheres well to a clean substrate upon contact at any temperature within said 50° C. range.

37. Sheet material of claim 36 in which the adhesive layer comprises one or more acrylic copolymer of monomers, up to 50 mol % of which is at least one copolymerizable monomer selected from acrylic acid, methacrylic acid, itaconic acid, maleic acid, maleic anhydride, amides of said acids, acrylonitrile, methacrylonitrile, and N-vinyl-2-pyrrolidone.

38. Sheet material of claim 36 in which the acrylic ester monomer is selected from alkyl acrylates having 1-8 carbon atoms in their alkyl groups, alkyl methacrylates having 1-8 carbon atoms in their alkyl groups, bornyl acrylates, bornyl methacrylates, 2-phenoxyethyl acrylate, 2-phenoxymethyl acrylate, the mono- and di-methyl and ethyl esters of itaconic acid, and the mono- and di-methyl and ethyl esters of maleic acid.

* * * * *

UNITED STATES PATENT AND TRADEMARK OFFICE
CERTIFICATE OF CORRECTION

PATENT NO. : 4,569,877

DATED : February 11, 1986

INVENTOR(S) : RICHARD J. TOLLEFSON, JAMES G. BERG and
PHILIP D. HINDERAKER

It is certified that error appears in the above-identified patent and that said Letters Patent is hereby corrected as shown below:

Claim 5, column 11, lines 2-3, "and ethyl esters of itaconic acid and the mono- and di- ethyl esters of maleic acid." should read --and; said adhesive layer adheres well to a clean substrate upon contact at any temperature within said $50°C$ range.--

Claim 10, column 11, lines 34-37, "methyl and surface of the adhesive layer surrounding the particle, whereby after adhesion of the adhesive layer to a substrate the film conforms around the particle and the particle is held against the substrate." should read --methyl and ethyl esters of itaconic acid and the mono- and di- ethyl esters of maleic acid.--

Claim 19, column 12, lines 21-23, "the exterior said adhesive layer adheres well to a clean substrate upon contact at any temperature within said $50°C$ range." should read --the exterior surface of the adhesive layer surrounding the particle, whereby after adhesion of the adhesive layer to a substrate the film conforms around the particle and the particle is held against the substrate.--

Signed and Sealed this

Twenty-first Day of October, 1986

[SEAL]

Attest:

DONALD J. QUIGG

Attesting Officer      Commissioner of Patents and Trademarks